United States Patent [19]

Lee

[11] Patent Number: 4,677,431
[45] Date of Patent: Jun. 30, 1987

[54] RASTER DISPLAY SMOOTHING TECHNIQUE

[75] Inventor: Michael G. Lee, Redmond, Wash.

[73] Assignee: Spacelabs, Inc., Chatsworth, Calif.

[21] Appl. No.: 768,972

[22] Filed: Aug. 23, 1985

[51] Int. Cl.[4] .............................................. G09G 1/14
[52] U.S. Cl. .................................... 340/728; 340/747; 340/722
[58] Field of Search ............... 340/747, 744, 728, 722, 340/791, 793

[56] References Cited

U.S. PATENT DOCUMENTS

| | | | |
|---|---|---|---|
| 4,212,009 | 7/1980 | Adleman et al. | 340/728 |
| 4,318,097 | 3/1982 | Oura | 340/728 |
| 4,586,037 | 4/1986 | Rosener et al. | 340/728 |
| 4,591,844 | 5/1986 | Hickin et al.[*] | 340/728 |
| 4,604,614 | 8/1986 | Farr et al. | 340/744 |
| 4,612,540 | 9/1986 | Pratt | 340/793 |

Primary Examiner—Gerald L. Brigance
Attorney, Agent, or Firm—Lawrence S. Levinson; Robert E. Lee, Jr.

[57] ABSTRACT

An apparatus and method for smoothing the reproduction of digitized waveforms on a raster scan line display by providing control signals which increase and decrease the electron beam pattern along the scan line in a trapezoidal pattern which is representative of the amplitude of the sampled waveform along that scan line. A microprocessor provides a plurality of digital signals which define the slopes of the increasing and decreasing ramps of the trapazoids and their starting points along the scan line. The digital signals for an entire frame of scan lines are stored during the frame blanking interval of the display and are accessed for each scan line during the scan line blanking interval. The digital signals are stored in a random access memory (RAM) at raster scan line addresses provided by the processor through a scroll counter and at digital signal addresses provided through a display controller. During scan line blanking intervals the scroll counter incrementally steps through raster scan line addresses starting with the last address provided by the processor during the storing of the data.

12 Claims, 12 Drawing Figures

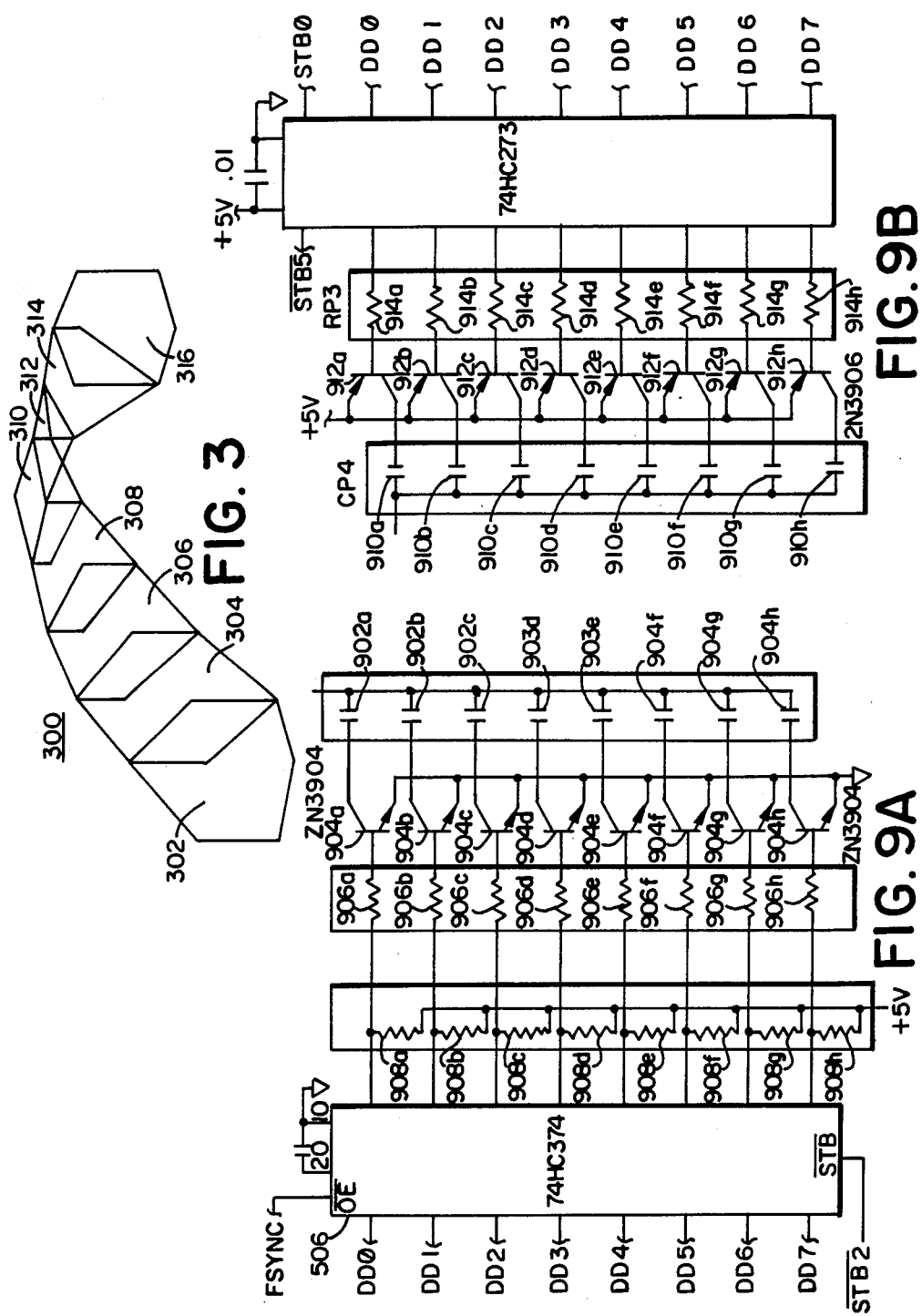

RASTER DISPLAY SMOOTHING TECHNIQUE

BACKGROUND OF THE INVENTION

The present invention relates to a raster scan display such as that used in a cathode ray tube (CRT). In particular, it relates to a circuit capable of providing a smooth raster scan display of the type used in monitoring or signal display equipment.

Normal bit mapped pixel graphics are often not satisfactory for presentation of medical waveforms due to the jaggedness which occurs when drawing lines which are not parallel to the deflection axes of the CRT. The jaggedness may be reduced by employing a large number of scan lines (and hence a very high deflection frequency) and by using a very high "dot clock" frequency. As the resolution of a display is increased, the cost of memory to support the display quickly makes this approach impractical for moderate cost medical monitors.

With a resolution of 720 lines wide by 2048 pixels high jaggedness is both noticeable and objectionable. Jaggedness may be reduced by varying the brightness of the CRT beam in a manner that smooths out the steps between adjacent illuminated portions of scan lines on a vertical raster display. For example, in U.S. Pat. No. 4,212,009, entitled SMOOTHING A RASTER DISPLAY which issued to G. L. Adleman et al. on July 8, 1980, a linear brightness control technique which makes use of computer controlled positive and negative current sources which vary the voltage on a capacitor which is then used to modulate the width of an electron beam during a raster scan is disclosed. As described therein, the slope of the voltage which is generated on the capacitor is determined by the output of a computer controlled constant current source. Accordingly, the technique involved the use of a pair of digitally controlled current sources and a switch to generate the up and down linear voltage ramps on the capacitor to form diamond shaped beam patterns. Unfortunately, ramp length, i.e. the time required for the voltage to reach a particular value, is not a linear function of current. In particular, $$i = C(dv/vt)$$

where i equals the current value, C equals the capacitor value and dv/vt represents the rate of change of voltage with respect to time. Accordingly, doubling the current leads to a ramp having half the length. Using the approach described by Adelman et al., accurate control of the ramp length (slope) becomes very difficult at low current levels. It is also very difficult to accurately clamp the top of the ramp with currents which may vary over more than two orders of magnitude.

Accordingly, a linear approach to beam modulation which does not rely upon a highly variable current source and which includes provision for a generalized diamond shape such as a trapezoidal shaped pattern as well as a diamond shaped pattern for added flexibility in smoothing out the display would be desirable. Also, a method and apparatus for smoothing the display for digital waveforms which is not overly expensive due to large memory costs is also desirable.

SUMMARY OF THE INVENTION

An improved method and apparatus for smoothing the reproduction of digitized waveforms on a raster scan line display is provided. A trapezoidal beam pattern for each scan which is representative of the amplitude of the sampled waveform along the scan line is defined by a plurality of digital signals. The digital signals (in the preferred embodiment six bytes of data) define the length of the increasing and decreasing ramps and the starting points of each ramp.

The digital signals are calculated using the digital signal values of a previous scan line and the sampled data value of the next scan line. All digital signals for a frame of raster scan lines are stored in a RAM during the frame blanking intervals, the addresses of the raster scan lines within the RAM being provided by passing them through a scroll counter during writing i.e., during the frame blanking intervals.

During each raster scan line blanking interval, the scroll counter incrementally increases the raster scan line address to locate the digital signals for each scan line. In response to the digital signals the beam is increased and decreased in width to form a trapezoidal beam pattern. The beam size is controlled by direct control of the beam current which affects luminance and spot size and thereby perceived spot size.

During the frame blanking intervals the scroll counter merely passes on the raster scan line addresses it receives from the processor which produces the digital signals for the trapezoidal beam pattern. Initially on power up it takes a plurality of frame blanking intervals to fill the RAM. Thereafter, only a portion of the raster scan lines are updated and need to be stored in RAM. The last address provided during each update is stored in the scroll counter and is used as the starting point for incrementing raster scan lines during the display period. By starting the storage of the update raster scan lines at a raster scan address located an incremental number of addresses from the previous addresses of the raster scan lines being updated, scrolling of the waveform in the display is accomplished.

The digital signals for starting the increasing and decreasing ramp portion of the trapezoidal pattern are latched into delay circuits during each scan line blanking interval. Also, during this interval the digital signals for defining the lengths of the increasing and decreasing ramps are latched into ramp circuits. After a delay along the raster scan dictated by the delay circuit, a switchable current source is switched by the delay circuit output signal to switch current into the increasing ramp circuit where output is provided to a combination output circuit. A similar event occurs for the decreasing ramp. The combination output circuit provides as an output the lesser of the two signals.

Each ramp circuit comprises a latch coupled in parallel to a plurality of capacitors. The capacitors are coupled together on their opposite sides to a switchable current source. When the current source switches current into the capacitors in response to the delay circuit output signal, a linear ramp signal is created whose slope is dependent on the capacitors selected by latch coupled thereto.

BRIEF DESCRIPTION OF THE DRAWINGS

FIG. 3 is representative of a smoothed waveform constructed from trapezoidal beam patterns located along a plurality of adjacent raster scan lines.

FIGS. 9A and 9B are more detailed block diagrams of ramp circuit portions of the waveform generator module portion of FIG. 5.

DETAILED DESCRIPTION OF THE DRAWINGS

Figure 1:
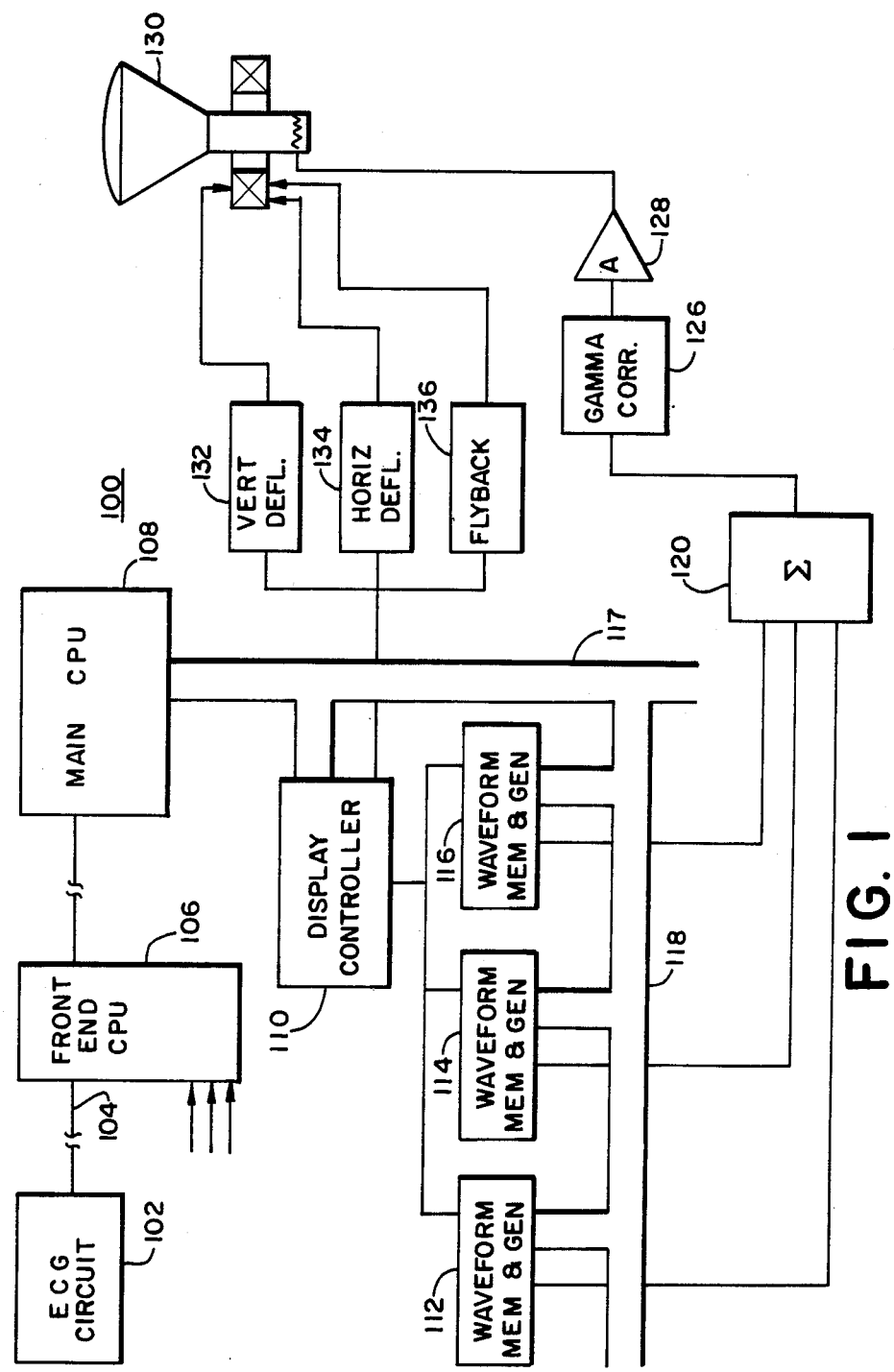
FIG. 1 is an overall block diagram of a medical monitor and display incorporating the present invention waveform memory and generator circuit.

Referring to FIG. 1, a block diagram of a medical monitor designated generally 100 using the present invention is disclosed. A monitor may be used to measure a number of patient parameters such as ECG, pulse, pressure and temperature. In the case of ECG, for example, it is necessary to display the ECG waveform. In one embodiment of a monitor, the ECG is measured and digitized by ECG circuit 102 and the data is transmitted serially over link 104 to a front end CPU 106. Pulse, pressure and temperature are also provided to the CPU 106 which performs various housekeeping functions before transmitting all of the parameter data to a main CPU 108. In the preferred embodiment the CPU 106 is an Intel 8031 microprocessor and the CPU 108 is an Intel 80188 microprocessor. The ECG circuit 102 can be of any conventional design wherein the ECG is measured by a multiple electrode system, e.g., three electrodes or five electrodes, and the resultant analog signals are digitized in conventional manner.

FIG. 1 shows a display controller circuit 110 and three waveform memory and generator modules 112, 114 and 116 coupled thereto. The modules 112, 114 and 116 are also coupled to the data and address bus 117 of the CPU 108 by bus 118 and they receive data therefrom under the control of the display controller 110. The outputs of the modules 112, 114 and 116 are provided via summing circuit 120, gamma correction circuit 126, and video amplifier circuit 128 to the grid of a cathode ray tube (CRT) 130. Vertical deflection circuit 132, horizontal deflection circuit 134 and a high voltage flyback circuit 136 provide raster and the anode high voltage supply scan signals to the CRT in response to control signals from the controller 110. In combination these signals to the CRT produce displayed waveforms, one waveform for each waveform memory and generator module 112, 114 and 116. The summing circuit 120, the gamma correction circuit 126 and the video amplifier circuit 128 as well as the deflection circuits 132 and 134 and flyback circuit 136 are all conventional in design and well known in the art. Although only three modules 112, 114, 116 are shown any reasonable number of modules from one to five or more could be used depending on the timing of the display parameters and capabilities of LSI circuits.

In the preferred embodiment, there are 720 active raster scan lines in a single display frame and 56 frames per second. Only 512 scan lines of each frame are used for displaying waveform data. The remaining space is used for displaying alphanumeric characters etc. The raster scan lines are vertical starting at the bottom of the screen and ending at the top. Using an LSI/6545 display controller chip manufactured, e.g., by Synetek or Rockwell the display controller generates a 43.008 KHz fast scanning signal and a 56 Hz slow scanning signal which are used to generate vertical and horizontal blanking and synchronization signals that are used by the deflection circuits and by the modules 112, 114 and 116.

Each raster scan line is further divided into 256 pixels by a 15 MHz clock. Additional resolution to 4096 pixels is provided by a switched capacitor analog technique to be described in further detail hereinafter. If a waveform is created merely by illuminating uniformly selected pixels in each scan line, for the raster scan line and pixel rates described above, the waveforms would have an objectionable jagged appearance. Waveform smoothing can be accomplished, however, by linearly varying the brightness of the electron beam along each raster scan line at the location where the waveform intersects the scan line. In the HP patent, U.S. Pat. No. 4,212,009, the linear approach disclosed uses diamond shaped brightness patterns whose shapes are controlled by the amplitudes of the points of intersection of the waveform with at least three successive parallel paths, for example, with at least three successive raster scan lines. In the present invention, however, although diamond patterns may be used, preferably trapezoidal patterns are used.

DATA FORMATTING FOR TRAPEZOIDAL BEAM PATTERN DISPLAY

There are two aspects to forming the trapezoidal beam patterns for smoothing. One is the hardware, in particular the modules 112, 114, and 116 of which more detail will be provided in connection with a description of FIGS. 3, 4 and 5 hereinafter, and the other is the proessing by CPU 108 of the raw sampled data of the waveforms provided by ECG circuit 102.

Figure 2:
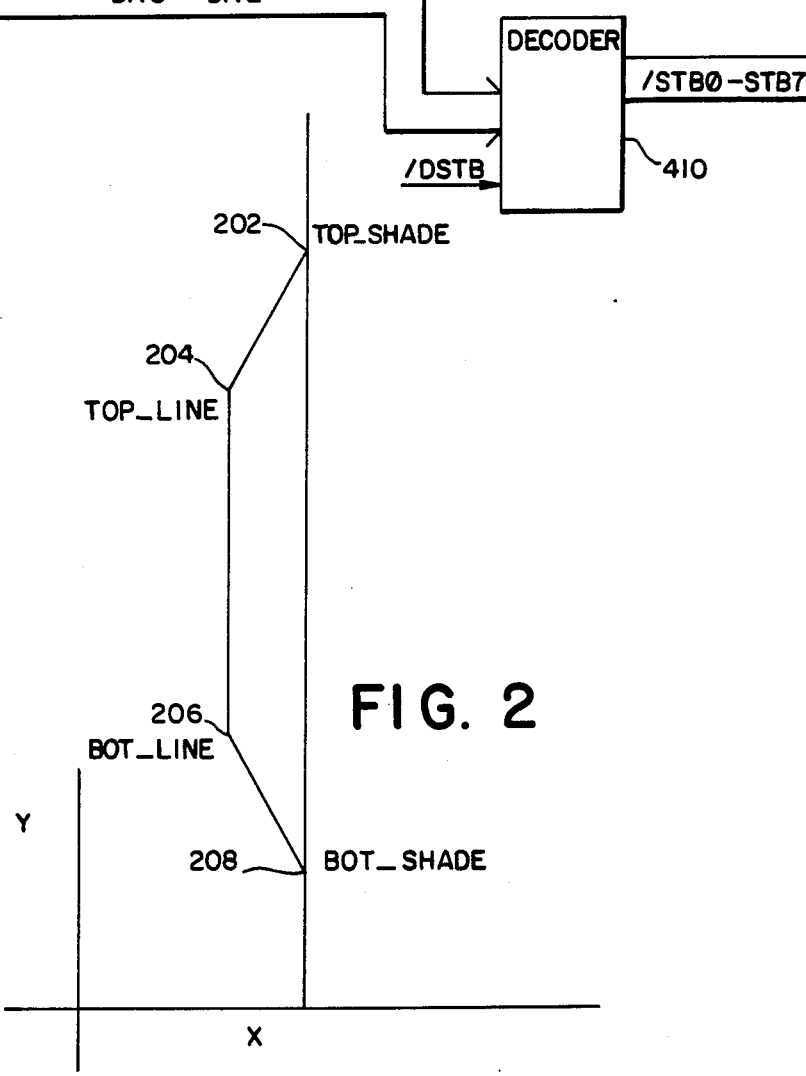
FIG. 2 is a diagram showing the boundaries of one half of the trapezoidal beam pattern produced by the waveform memory and generator circuit.

In general, a plurality of sample waveform points is created along each raster scan line. The amplitude of each sample point is proportional to the Y pixel location measured from the X axis. The X raster scan line is proportional to the distance from the Y axis. In order to specify the trapezoidal beam pattern of the waveform along a particular scan line a raster scan line descriptor is formed. Referring to FIG. 2, the raster scan line descriptor consists of five 16 bit words: the Y coordinate of a selected sample value of the raster scan line; the pixel address of the top of the trapezoid 202 as measured from the X-axis, known as TOP_SHADE; the pixel address of the top of the trapezoid line segment 204 as measured from the X-axis known as TOP_LINE; the pixel address of the bottom of the trapezoidal line segment 206 as measured from the X-axis known as BOT_LINE; and the pixel address of the bottom of the trapezoid 208 as measured from the X-axis known as BOT_SHADE. The selected sample value, Y, is obtained by selecting the sample value from the plurality of samples measured by circuit 102 along the raster scan line which has the largest deviation from the mean of all the samples in the previous scan line.

In order to minimize the time required to calculate a new descriptor, a new descriptor is calculated using the most recent previous descriptor and the latest averaged sample. The algorithm uses only simple magnitude comparisons, addition and subtraction. Three algorithms were investigated, all having greater or lesser amounts of asymmetry in the resulting calculated waveform. Achieving full symmetry, while possible, would have required a more complicated algorithm and processing of additional past history data. It was clear that this additional processing would result in an unacceptable utilization of the available processing time, given the other necessary tasks to be performed by the computer in the patient monitor. The algorithm chosen is the last one presented below, termed Overlapping, Horizontally Non-Symmetric. The horizontal asymmetry around inflection points is slight, resulting in a display nearly indistinguishable from a beam directed display.

Given a new raster scan line from which a designator is to be found the local slope of the waveform from the previous raster scan line is first calculated:

slope = Y(X) − Y(X−1)/Delta X (Delta X = 1)

where X represents the current selected sample or raster segment descriptor, and X−1 represents the previous data sample or descriptor. Depending on the slope, one of three functions is then applied, as shown in the algorithms below, completing the previous raster segment descriptor and starting the current descriptor. After these descriptors are calculated, the previous descriptor is reformatted and output to the waveform display hardware, and the current descriptor is moved into the previous descriptor area in preparation for the next sample.

A. NON-OVERLAPPING, HORIZONTALLY NON-SYMMETRIC

For positive slopes:

TOP_SHADE(X−1)=MAX(TOP_SHADE(X-1), RAW_DATA(X))

TOP_SHADE(X)=MAX((RAW_DATA(X)+1),TOP_LINE(X−1))

TOP_LINE(X)=RAW_DATA(X)

BOT_LINE(X)=MIN(RAW_DATA(X),(TOP_LINE(X−1)+1))

BOT_SHADE(X)=BOT_LINE(X−1)

For negative slopes:

TOP_SHADE(X)=TOP_LINE(X−1)

TOP_LINE(X)=MAX(RAW_DATA(X),(BOT_LINE(X−1)−1))

BOT_LINE(X)=RAW_DATA(X)

BOT_13 SHADE(X)=MIN((RAW_DATA(X)−1),BOT_LINE(X−1))

BOT_SHADE(X−1)=MIN(BOT_LINE(X−1),(RAW_DATA(X)))

For slopes equal to zero:

TOP_SHADE(X)=MAX(TOP_LINE(X−1),(RAW_DATA(X)+1))

TOP_LINE (X)=RAW_DATA (X)

BOT_LINE (X)=RAW_DATA (X)

BOT_SHADE(X)=MIN(BOT_LINE(X−1),(RAW_DATA(X)−1))

B. VERTICALLY NON-symmetric

For positive slopes:

TOP_SHADE(X−1)=MAX(RAW_DATA(X), TOP_SHADE (X−1))

TOP_LINE (X−1)=MAX(TOP_LINE(X−1),(RAW_DATA(X)−1))

TOP_SHADE(X)=MAX((RAW DATA(X)+1), TOP_LINE(X−1))

TOP_LINE(X)=RAW_DATA(X)

BOT_LINE(X)=RAW_DATA(X)

BOT_SHADE(X)=BOT_LINE(X−1)

For negative slopes:

TOP_SHADE(X)=TOP_LINE(X−1)

TOP_LINE(X)=MAX(RAW_DATA(X),(BOT_LINE(X−1)−1))

BOT_LINE(X)=RAW_DATA(X)

BOT_SHADE(X)=MIN((RAW_DATA(X)-1),BOT_LINE(X−1))

BOT_SHADE(X−1)=MIN(BOT_SHADE(X−1), RAW_DATA (X))

For slopes equal to zero:

TOP_SHADE(X)=MAX((RAW_DATA(X)+1), TOP_LINE(X−1))

TOP_LINE(X)=RAW_DATA(X)

BOT_LINE(X)=RAW_DATA(X)

BOT_SHADE(X)=MIN(BOT_LINE(X−1),-(RAW_DATA(X)−1))

C. OVERLAPPING, HORIZONTALLY NON-SYMMETRIC

For positive slopes:

TOP_SHADE(X−1)=MAX(TOP_SHADE(X−1), RAW_DATA(X))

TOP_SHADE(X)=MAX(RAW_DATA(X)+1), TOP_LINE(X−1))

TOP_LINE(X)=RAW_DATA(X)

BOT_LINE(X)=MIN((RAW_DATA(X−1)+1), RAW_DATA(X))

BOT_SHADE(X)=BOT_LINE(X−1)

For negative slopes:

TOP_SHADE(X)=TOP_LINE(X−1)

TOP_LINE(X)=MAX-((RAW_DATA(X−1)−1), RAW_DATA(X))

BOT_LINE(X)=RAW_DATA(X)

BOT_SHADE(X)=MIN((RAW_DATA(X)−1),
    BOT_LINE(X−1))

BOT_SHADE(X−1)=MIN(BOT_
    SHADE(X−1), RAW_DATA(X))

For slopes equal to zero:

TOP_SHADE(X)=MAX(TOP_LINE(X−1),-
    (RAW_DATA(X)+1))

TOP_LINE(X)=RAW_DATA(X)

TOP_LINE(X)=RAW_DATA(X)

BOT_SHADE(X)=MIN(BOT_LINE(X−1),-
    (RAW_DATA(X)−1))

In each of the algorithms A, B, C above where the expression MAX (A,B) occurs, the quantity with the largest pixel address is chosen; where MIN (A,B) occurs, the quantity with the minimum pixel address is chosen. The term RAW_DATA(X) means the Y coordinate of the selected sample along raster scan line X.

Each raster scan line trapezoidal beam pattern is determined from the descriptor and comprises four data points requiring six bytes. These four data points are: start position of the increasing intensity ramp of the trapezoid (BOT_SHADE(X) 208); length of the increasing intensity ramp (BOT_LINE(X) 206-BOT_SHADE(X) 208); the start position of the decreasing intensity ramp (TOP_LINE(X) 204), and the length of the decreasing intensity ramp (TOP_SHADE(X)202-TOP_LINE (X)204). The start locations are 12 bit values, each stored in two bytes, and the ramp lengths are 8 bit values, each stored in one byte.

The above described six bytes are the data actually transmitted to the waveform memory and generator modules 112, 114 and 116 for forming the trapezoid shaped raster scan line segment of a waveform measured by circuit 102. These values are obtained from one of the A,B, or C algorithm manipulations given above, although algorithm C is preferred. However, the hardware implementation to be described next is not dependent specifically upon the algorithm chosen but will work equally well with all three or with others which might be devised. It should be noted that for a given raster scan line the algorithm is unable to complete the value for TOP_SHADE until the data for the next scan line is available. Hence, the data being transmitted to the modules 112, 114 and 116 are always one scan line behind that which is being processed by CPU 108.

The conversion of a raster segment descriptor into a form suitable for sending to the display hardware is not as straightforward as it might appear. The problem is that only the start points and lengths of the intensity ramps are specified, and the end points fall accordingly. However, the lengths are specified with reduced resolution and range, and there is a minimum ramp length due to the finite rise time of real circuits. Allowances must be made for both of these factors. It is most important to place the highest intensity portion of the ramp at the correct location along the scan line. The low intensity portion of the ramps fade out such that the eye cannot tell if the positioning (i.e., the length) is correct. Small errors are easily tolerated. However, errors in the position of the high intensity end are very apparent. Consequently, the actual length of the bottom ramp (corrected for the factors above) is subtracted from the desired position of the top of the ramp in order to generate the ramp start position which is passed to the hardware.

FIG. 3 depicts a waveform 300 formed by adjacent raster scan trapezoidal beam patterns even number 302 through 316.

HARDWARE IMPLEMENTATION FOR LINEARLY CONTROLLED BEAM PATTERN DISPLAY

Figure 4:
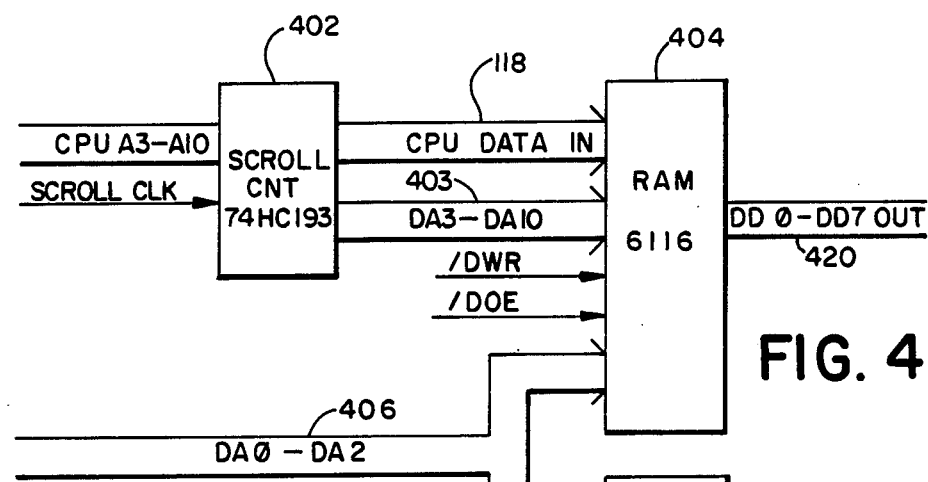
FIG. 4 is a block diagram of a memory module portion of the present invention circuit.
Figure 5:
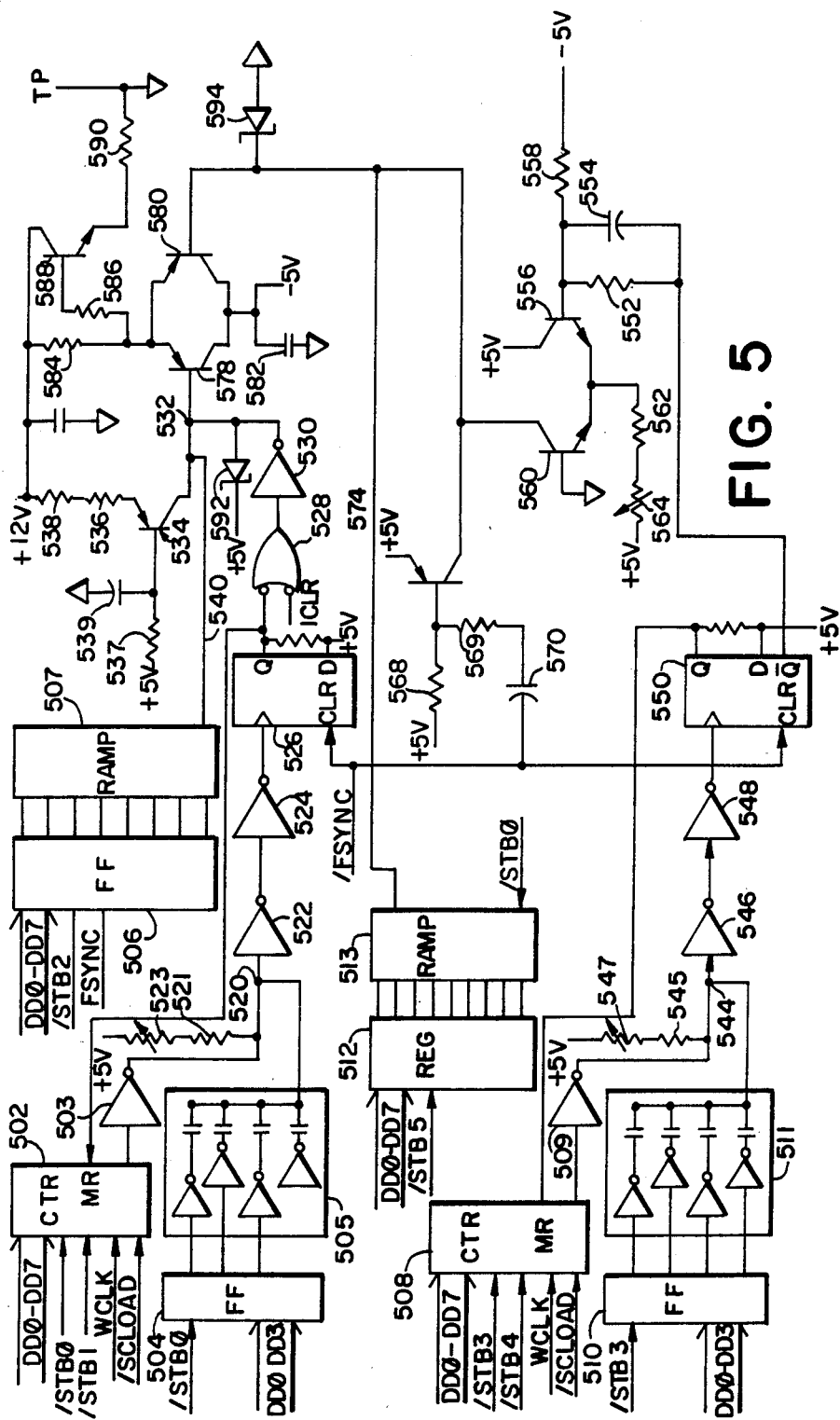
FIG. 5 is a detailed block diagram of a waveform generator portion of the present invention circuit.

Referring now to FIGS. 4 and 5, during horizontal retrace periods between display frames the CPU 108 loads a frame of waveform data to be displayed. This is done by loading six bytes of data for each of 512 scan lines into the waveform memory and generator modules 112,114 and 116. The CPU 108 must load a separate frame of waveform data into each module. FIGS. 4 and 5 show one of these modules.

During initial power up of the monitor, the CPU 108 begins loading a frame of data by loading only a portion of the raster scan lines during any one frame blanking interval. Thereafter, only a portion of the raster scan lines are updated at any one time in subsequent frame blanking intervals.

In FIG. 4, a nine bit scroll counter 402 is coupled directly to the CPU 108 address lines A3 to A11. The scroll counter in turn provides a nine bit address required to select 1 of 512 chunks of 8 bytes each via bus 403 to a RAM memory 404 comprising two 2K by 8 bit 6116 devices made by RCA. Three separate address lines DA0-DA2 are provided via display controller 110 by bus 406 to the RAM memory 404 and also to decoder 410. In the preferred embodiment the scroll counters comprise 74HC193 counters while the decoder is a 74HCT138 device.

During the horizontal blanking period, the display controller circuitry selects one of the modules 112, 114 and 116. The CPU 108 provides 12 bit addresses (the first three of which select which byte of eight) through the scroll counter 402 and display controller 110 to load the trapezoidal pattern waveform data for the new updated scan line into the RAM 404. A /DWR signal is provided by the CPU 108 to the RAM 404 during this time.

After horizontal blanking, before the start of each vertical scan, the scroll counter, starting with the last address loaded therein by the CPU 108 during horizontal blanking, sends out 9 bit raster scan line addresses to the RAM 404. The scroll count is incremented with each raster scan in response to the scroll clock signal provided by controller 110. With each 9 bit address provided by counter 402, the display controller 110 provides six three bit incremental addresses via bus 406 to RAM 404. The nine most significant scroll address bits select the raster scan line while the three least significant address bits, DA0-DA2, select the six bytes for that raster scan line that describe the trapezoidal pattern. Each byte is transmitted over data bus 420 to various latches to be described in FIG. 5. The sequentially transmitted data bytes are strobed into the proper latches by the /STB0-/STB7 strobe signals generated by decoder 410. The strobe signals are generated during the five microseconds immediately preceeding the active portion of the scan.

It should be understood that not all the data in RAM has to be rewritten since most of it is the same from frame to frame except that it must be displayed as moving across the display, new data usually entering from one end or the other (although this is not necessary). In the case of a moving chart display the waveforms move from right to left. If it is supposed that after initial power up the data is located in RAM from addresses 0 to 511 so that RAM location 511 appears on the right of the display and contains the revised data while 0, the oldest, then unless the scroll counter pointer is changed the waveform will remain stationary. See line 1 below. Since new data enters from the right, one can write two frames of new data into the oldest locations 0 and 1, for example, during a frame blanking period with the last address entered into the scroll counter as 1. See line 2 below. The scroll counter will start the next display frame with 1 and decrement through from 1 to 2 in line 2 below.

| (1) | 0 | 1 | 2 . . . 509 | 510 | 511 |
| (2) | 2 | 3 | 4 . . . 511 | 0   | 1   |

In this manner only a portion of the raster scan lines have to be updated during each frame blanking interval and by using the scroll counter the waveform moves across the display. The more lines which are updated the faster the waveform moves. In the preferred embodiment, the speed will vary from 6.25 mm/sec by updating one scan line every other frame interval to 50 mm/sec by updating four scan lines every frame blanking interval.

In scrolling the waveform in the manner described, it is important that the updated raster scan lines be in numerical order and that the sequence be continuous with the last address loaded in the scroll counter.

Referring now to FIG. 5, in response to /STB0 and /STB1, the twelve bit start location (BOT_SHADE 208) is loaded into 8 bit counter 502 and 4 bit flip flop 504. An 8 bit increasing ramp length dataword (BOT_LINE 206-BOT_SHADE 208) is latched into flip flop circuit 506 by /STB2. Similarly, a twelve bit start location, TOP_LINE 204, for the down ramp is loaded into 8 bit counter 508 and four bit flip flop 510 by /STB 3 and 4 while an 8 bit decreasing ramp length (TOP_SHADE 202-TOP_LINE 204) is latched into 8 bit register 512 by /STB5.

The Q outputs of flip flop circuit 504 are coupled to the four bit delay circuit 505 comprising four open collector invertors coupling the Q outputs to four capacitors in parallel. The opposite sides of the capacitors are coupled together to provide a single output which is coupled to the output of counter circuit 502 through open collector invertor 503 at junction 520. Junction 520 is coupled through resistor 521 and variable resistor 523 in series to a plus 5 volt supply and to the input of an inverting Schmitt trigger circuit 522 which in turn is coupled to Schmitt trigger circuit 524 where the combined signal from circuit 502 and circuit 505 is coupled to the clock input of D flip flop 526 whose Q output is one input to NOR gate 528. The output of gate 528 is coupled via open collector inverter 530 to junction 532. Junction 532 is coupled through the collector-emitter of transistor 534 and series resistors 536 and 538 to a twelve volt power supply. The base of transister 534 is coupled through resistor 537 to a +5 volt source and through capacitor 539 to ground.

The Q outputs of 8 bit flip flop circuit 506 are coupled in parallel to eight bit timer circuit 507 comprising eight capacitors and respective switches in parallel. The Q outputs are coupled to one side of the eight capacitors through the switches while the opposite sides of the capacitors are coupled together to provide a single output 540 which is also coupled to the collector of transistor 534.

The Q outputs of flip flop circuit 510 are coupled to the four bit delay circuit 511 comprising four open collector invertors coupling the Q outputs to four capacitors in parallel. The opposite sides of the capacitors are coupled together to provide a single output which is coupled to the output of counter circuit 508 through open collector invertor 509 at junction 544. Junction 544 is coupled through resistor 545 and variable resistor 547 to a plus 5 volt supply and to the input of inverting Schmitt trigger circuit 546 whose output is coupled to the input of Schmitt trigger circuit 548 where the combined signal from circuit 508 and circuit 511 is coupled to the clock input of D flip flop 550.

The /Q output of flip flop 550 is coupled through resistor 552 and capacitor 554 in parallel to the base of transistor 556 and through resistor 558 to a minus 5 volt supply. The collector of transistor 556 is coupled to plus 5 volts. Transistor 556 is emitter coupled to transistor 560 and through series resistors 562 and 564 to plus 5 volts. Resistor 564 is variable. The base of transistor 560 is coupled to ground while its collector is coupled to the collector of transistor 566 whose emitter is coupled to plus 5 volts and whose base is coupled through resistor 568 to plus 5 volts and through resistor 569 and capacitor 570 in series to FSYNC.

The Q outputs of 8 bit flip flop circuit 512 are coupled in parallel to eight bit ramp circuit 513 comprising eight capacitors and respective switches in parallel. The Q outputs are coupled to one side of the 8 capacitors through the switches while the opposite sides of the capacitors are coupled together to provide a single output 574 coupled to the collectors of transistors 560 and 566.

The circuit of FIG. 5 further comprises an output circuit including emitter and collector coupled transitors 578 and 580. The collectors are coupled to ground through capacitor 582 and to minus 5 volts. Their emitters are coupled through resistor 584 to plus +12 volts and through resistor 586 to the base of output transistor 588. The emitter of transistor 588 through resistor 590 provides the output signal of the waveform memory and generator module which is combined with the output of all other modules in summing circuit 120 in FIG. 1.

It should be noted that in the preferred embodiment open collector invertors 503, those of circuit 505, 530, 509 and those of circuit 511 are 74LS05 devices.

OPERATION OF THE WAVEFORM MEMORY AND GENERATOR MODULE

Figure 8:
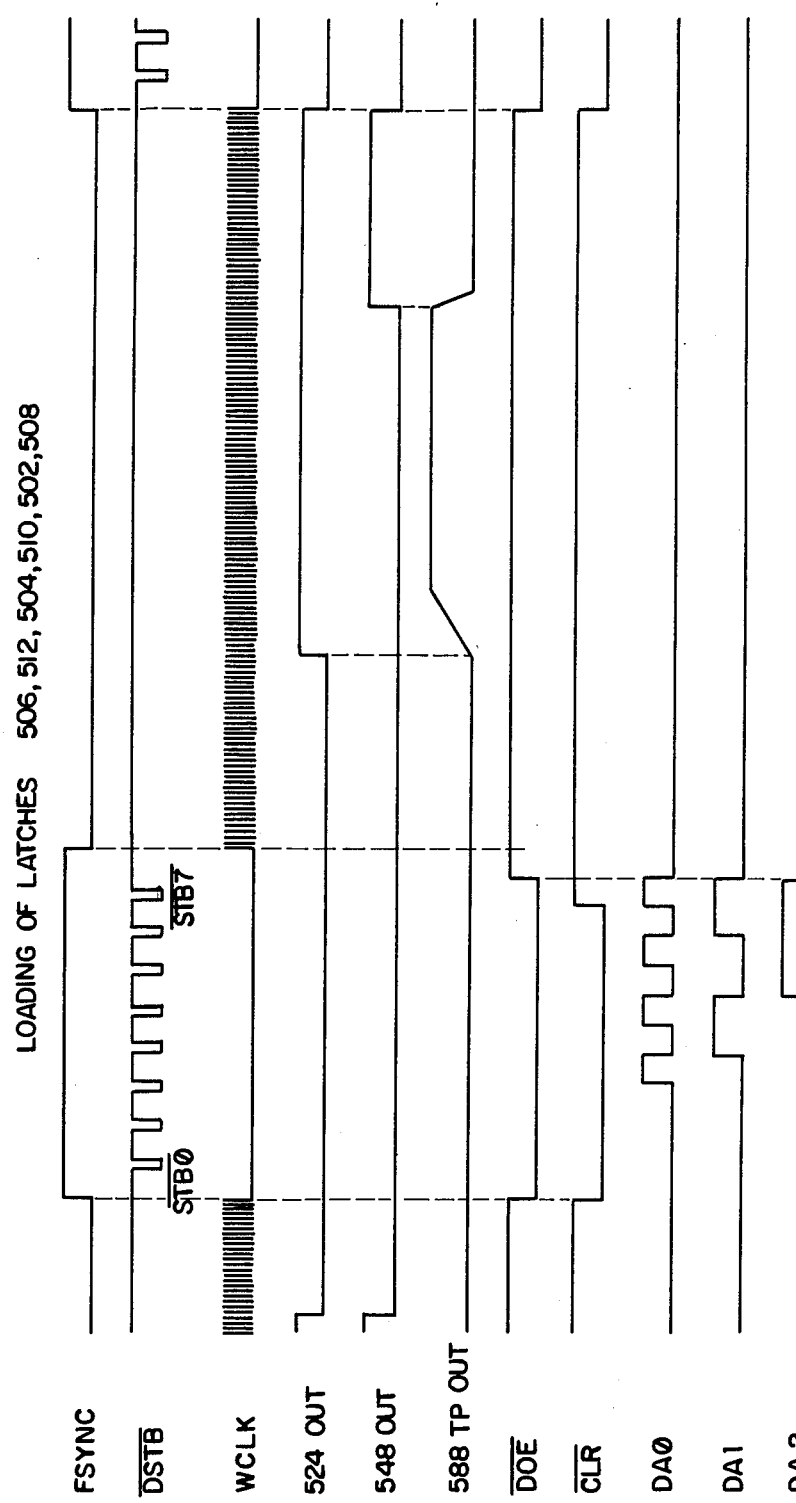
FIG. 8 is a timing diagram showing the relative timing of various control signals used by the present invention circuit.

As mentioned earlier, the counters 502 and 508, the 4 bit flip flops 504 and 510 and the eight bit registers 506 and 512 are loaded with data from RAM 404 during the positive portion of FSYNC shown in FIG. 8 while the CRT beam is blanked. As the CRT beam begins scanning from the bottom to the top of the screen, a 15 MHz clock, WCLK in FIG. 8, is gated on at the clock input to the eight bit down counters 502 and 508. The counters provide a digitally programmable delay of between approximately 64 and 16320 nanoseconds (ns) with a resolution of 64 ns beginning at the time the 15 MHz clock is gated on. The four bit delay circuits 504 and 510, each uses a switched binary sequence of capacitors in combination with the resistor pairs 521, 523 and 545, 547 with +5 volts, respectively, to provide 16 different delay durations with a resolution of 4 ns. The associated resistor pair in combination with the capacitance of the parallel capacitors selected by the data stored in the associated flip flop provides an adjustable RC time constant for triggering the associated Schmitt trigger circuits. Connected together the counter and delay circuit combinations 502 and 504 and 508 and 510 provide accurate delay times of 64 to 16384 ns plus a fixed propogation delay time of no consequence with a resolution of 4 ns. After the coarse delay (most significant 8 bits) of the programmable delay time generated by counter 502 is completed the output of counter 502 goes to a "0" state. The output of invertor 503 goes to its open collector state allowing node 520 to rise at a rate dependent upon the total capacitance presented by circuit 505 and the resistance provided by resistors 523 and 521. Schmitt trigger circuit 522 provides a clean and stable voltage threshold and thus low jitter delay. More details concerning operation of the delay circuit combinations 504, 505 and 510, 511 is provided in my copending patent application entitled "Dynamically Variable Linear Circuit" hereby incorporated by reference as if specifically set forth herein.

At the end of their digitally controlled time delays, the circuits 505 and 511 set flip flops 526 and 550, respectively. Flip flop 526 allows the constant current source made up of the 12 volt source, resistor pair 536 and 538 and transistor 534, to steer current to the ramp circuit 507 whose capacitors were discharged to zero volts during the positive portion of FSYNC. The timer circuit comprises a binary series of eight capacitors allowing digital selection of total capacitance of about 40 to 6400 picofarads (pf), in steps of about 25 pf. Capacitors are selected or not selected according to the data latched into flip flop 506 and thus provide a digitally controlled increasing ramp signal provided to the base of transistor 578. Since a constant current source charges the capacitor bank of 507 the voltage rises linearly from zero until it reaches a clamp at +5 volts provided by diode 592. Flip flop 526 is cleared at the end of the vertical scan and this switches the constant current source to ground through the open collector inverter 530 during the latching of data for the next scan.

In a similar manner flip flop 550 allows the constant current source made up of the minus 5 volt power supply and the transistor circuit arrangement of transistors 556, 560 and 566 to steer current to the ramp circuit 513. In accordance with the data stored in flip flop 512, a digitally controlled linear decreasing ramp signal is provided by circuit 515 to the base of transistor 580. The down ramp signal starts at +5 volts and ramps down to a ground clamp at 594. Flip flop 550 is cleared at the end of the vertical scan by FSYNC.

The up and down ramp signals are combined and buffered by the transistor circuit 578 and 580 which provides an output corresponding to the lowest of the two ramp input signals. The final output is a trapezoidal pulse across resistor 590 synchronized with FSYNC. Waveform parameters from RAM 404 are loaded into the counters and flip flops before each new vertical scan line setting the start of the up and down ramp and the slope of each ramp. The outputs of all waveform memory and generator modules (one for each waveform) are mixed and gamma corrected before being applied to the video amplifiers to drive the CRT.

It should be understood that by appropriate adjustment of the start time for the decreasing ramp signal, the decreasing ramp can be programmed to begin just as the increasing ramp ends to form a diamond pattern instead of a trapezoidal pattern. Therefore, when the term trapezoidal is used throughout this application it includes a diamond pattern.

DISPLAY CONTROLLER

Figure 6:
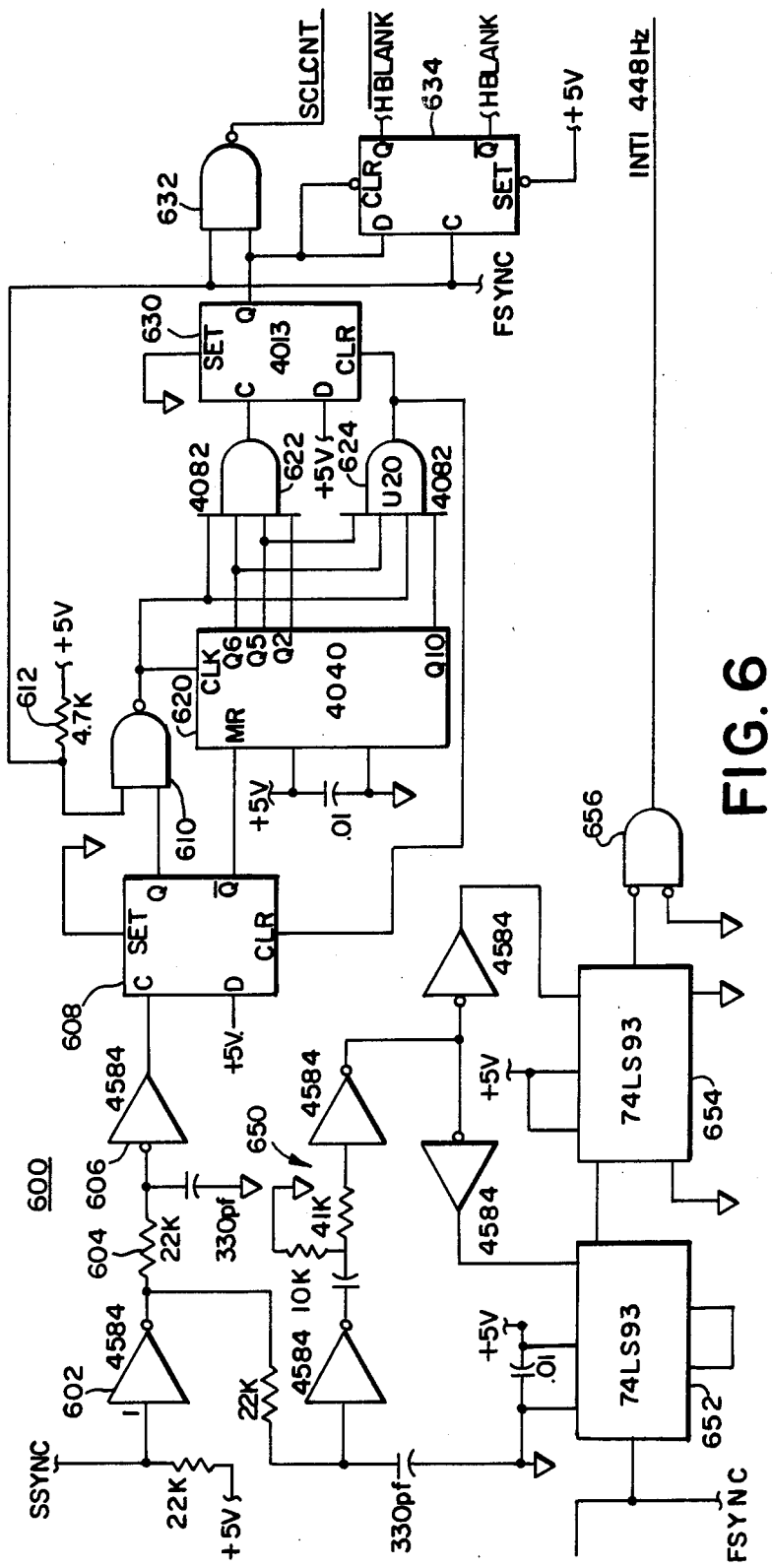
FIG. 6 is a block diagram of a first portion of a display controller of the present invention.

FIG. 6 is a display controller circuit designated generally 600 which takes the FSYNC and SSYNC signals from the 6545 display controller chip and generates the scroll count clock, SCLCNT and the horizontal blanking signals HBLANK and /HBLANK.

SSYNC is coupled to inverter 602 whose output is coupled via resistor 604 to invertor 606. The output of inverter 606 is the clock input to D flip flop 608 whose D input is tied to +5 volts. The set input is grounded. The Q output is provided as one input to NAND gate 610 whose other input is FSYNC.

The output of NAND gate 610 is provided as a clock to decoder 620 and as an input to quad input NAND gate 622. The other three inputs to NAND gate 622 are from the Q2, Q5, and Q6 outputs of decoder 620. The output of NAND gate 610, and the Q5, Q6 and Q10 signals from decoder 620 are input to quad input NAND gate 624. The output of NAND gate 622 is the clock input to D flip flop 630. The D input is tied to +5 volts and the set input is tied to ground. NAND gate 624 provides a clear signal to D flip flops 608 and 630. The Q output of D flip flop 630 is coupled with FSYNC to NAND gate 632 whose output is SCLCNT.

The Q output of D flip flop 630 is also provided to both the D and CLR inputs of D flip flop 634. FSYNC is provided as the clock to D flip flop 634, whose Q output is /HBLANK and whose Q output is HBLANK.

The circuit portions designated generally 650 comprising cascaded divide by sixteen counters 652 and 654 and whose inputs are FSYNC and the output of invertor 656 generates a 448 Hz INTI signal required by CPU 108.

Figure 7A:
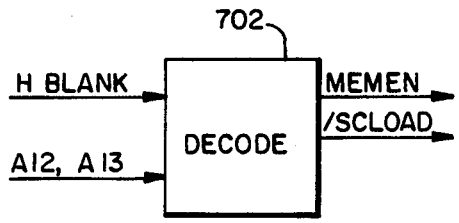
FIGS. 7A-7C are block diagrams of a memory module enable portion, an address counter portion and clock portion, respectively, of the display controller portion of the present invention.
Figure 7B:
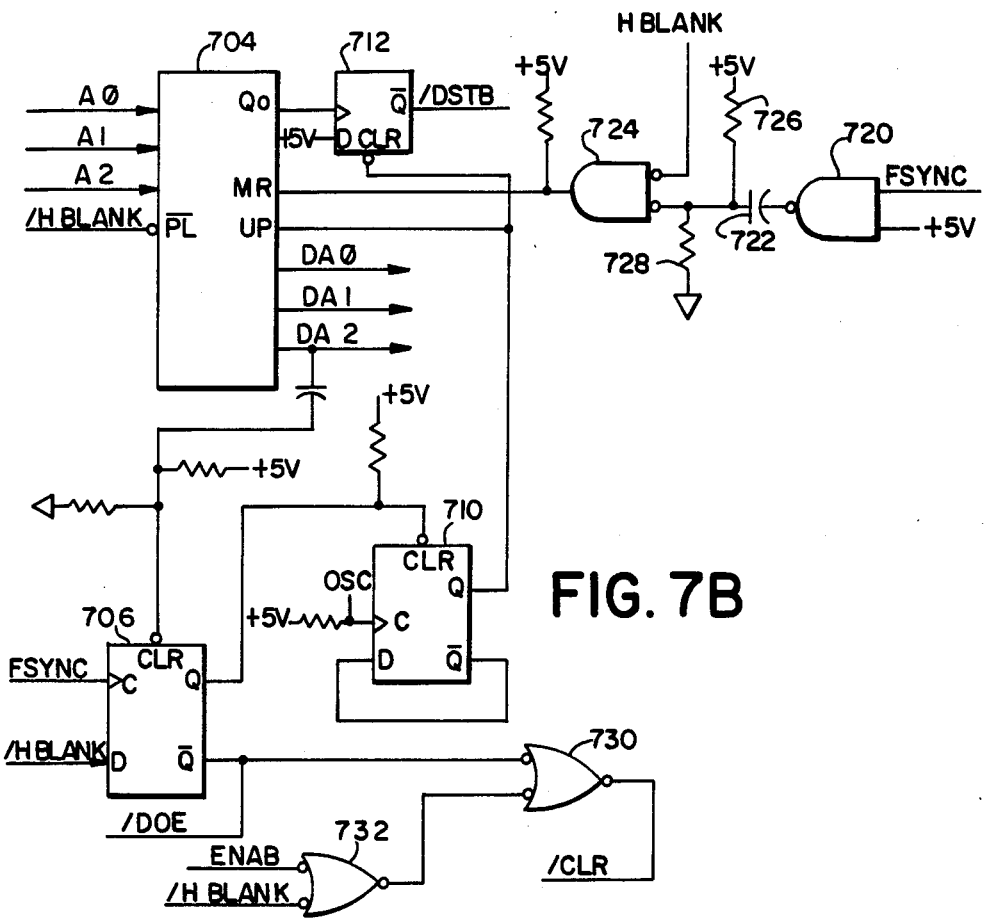
Figure 7C:
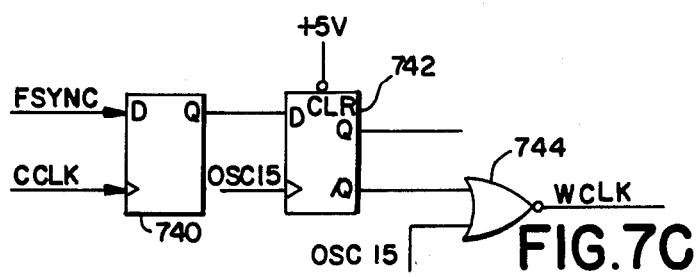

FIGS. 7A through 7C show in more detail the display controller circuit portion responsible for generating DA0-DA2, /DSTB, WCLK, /CLR and the module select and enable signals, /SCLOAD and MEMEN, the latter being generated by conventional decoder circuitry 702 in FIG. 7A in response to /HBLANK and the CPU 108 address lines A12 and A13.

Referring now to FIG. 7B, address lines A0 through A2 from CPU 108 and /HBLANK are coupled to up-/down counter 704 as inputs. FSYNC is provided as a clocking signal to D flip flop 706 and /HBLANK is coupled to the D input. The output signal DA2 from counter 704 provides a clear signal to D flip flop 706. The Q output of D flip flop 706 provides a clear signal to D flip flop 710 whose clock input is a 7.5 MHz oscillator. The /Q output is coupled to the D input. The Q output from flip flop 710 is coupled to the up count clock of counter 704 and to the clear port of D flip flop 712. The Q0 signal from counter 704 provides the clock for flip flop 712. The D input is pulled high and the /Q output provides /DSTB.

FSYNC and a plus 5 volt pull up are provided as inputs to NAND gate 720 whose output is coupled through capacitor 722 to one input of NAND gate 724. The other input to NAND gate 724 is HBLANK. The output of NAND gate 724 is the master reset for counter 204. The output of NAND gate 720 is also coupled to +5 volt by resistor 726 and to ground by resistor 728.

The circuit of FIG. 7B provides the control signals for the sequential loading of the counters and flip flops of FIG. 5. On the leading edge of FSYNC a short reset pulse generated by NAND gate 724 clears the four bit counter 704 to zero. At the same time the Q output of flip flop 706 goes high enabling flip flop 710 to begin dividing the 7.5 Mz clock by 2 and providing a 3.7 MHz clock to counter 704. As 704 counts up from the start point provided by the address lines A0–A2 which are loaded at the leading edge of /HBLANK, counter 704 generates the /DSTB pulses from /Q output of flip flop 712. The /DSTB pulse is active well after the DA0–DA2 outputs have settled. On each count 0 through 5, a /DSTB is generated which is coupled to decoder 710 enabling ito decode DA0–DA2 and provide clean strobes, /STB0 through /STB7, to each of the latches.

When the count from counter 704 reaches 6, flip flop 706 generates a clear signal to flip flop 710 to terminate the clock signal and loading of the latches of the waveform memory and generator circuit.

At the start of FSYNC, the /Q output of flip flop 706 went low to generate /DOE which enables the data outputs of RAM 404. Except during HBLANK all the MEMEN signals are active. Thus RAM's on all modules 112, 114 and 116 are simultaneously selected.

The /Q output of flip flop 706 is coupled to one input of NOR gate 730. An ENAB signal from the display controller chip and /HBLANK are coupled as inputs to NOR gate 732. Its output is the other input to NOR gate 730. The output of NOR gate 730 is /CLR.

The /CLR signal is coupled to the clear port of flip flops 526 and 550. It discharges the capacitors in timer circuits 507 and 513. It holds the down ramp at zero to effectively blank the waveform during any blanking interval. The /CLR signal goes low at the leading edge of FSYNC and remains low until the positive going edge of DA2. Thus /CLR will remain low while strobes are generated to latch address 502, 504, 506 and 510. The up ramp is held reset from /STB0 until the data is loaded at /STB5 in order to discharge all capacitors.

FIG. 7C is a display controller circuit which generates WCLK. FSYNC is coupled to D flip flop 740 while a 2.5 MHz clock clocks flip flop 740. The Q output is coupled to the D input of flip flop 742 whose clock is a 15 MHz oscillator. The /Q output is gated with the 15 MHz oscillator through NOR gate 744 to generate WCLK.

FIG. 9A is a more detailed block diagram of the ramp circuit 507. It comprises a bank of eight parallel capacitors 902a through 902h, eight transistors 904a through 904h, eight series resistors 906a through 906h, and eight resistors 908a through h coupled to +5 volts. Each parallel circuit comprises one side of a capacitor (902a) coupled to the collector of a transistor(904a) whose emitter is coupled together with the emitters of all other transistors 904 (b–h) to ground. The base of transistor 904a is coupled through series resistor 906a to one end of resistor 908a and then to the Q output of circuit 506. The other end of resistor 908a is coupled to plus 5 volts. The opposite ends of all the capacitors 902 a–h are coupled together to a collector of transistor 534.

The ramp circuit 513 of FIG. 9B is similar with capacitors 910 a–h; transistors 912 a–h and series resistors 914 a–h, except that no resistor circuits such as the circuits 908a–h are necessary.

When the constant current sources described earlier are switched to provide current to the capacitor bank of the ramp circuit, the slope of the voltage output signal, dv/dt, is determined by the total capacitance selected by the data stored in the associated register, either 506 or 512. A more detailed description of the selection of the capacitors and the operation of timer circuits 507 or 513 is given in my copending application entitled "Dynamically Variable Linear Circuit" hereby incorporated by reference as if specifically set forth herein.

What is claimed is:

1. Apparatus for reproducing digitally sampled waveforms on a cathode ray tube in which the beam is deflected to form a raster of parallel lines for each frame, there being a beam blanking interval between successive frames and between successive lines, said apparatus comprising:

means for producing a plurality of digital signals that define a trapezoidal beam pattern along each of said parallel lines which is representative of the amplitude of each of said sampled waveforms along said parallel line;

means for storing said digital signals for a frame of parallel lines during at least one frame blanking interval;

means for making available said digital signals for each scan line during a line blanking interval; and means responsive to said digital signals for linearly increasing and decreasing the width of said electron beam as it scans along a parallel line with starting locations and slopes for said increasing and decreasing portions represented by said digital signals.

2. The apparatus of claim 1 wherein said digital signal responsive means comprises a switchble current source; a digitally programmable ramp circuit responsive to a first plurality of said digital signals for generating the ramp control signals for increasing and decreasing the width of said electron beam as it scans along a parallel line; and;

a digitally programmable time delay circuit responsive to a second plurality of said digital signals for generating time delay signals for starting said ramp control signals.

3. The apparatus of claim 2 wherein said ramp circuit comprises separate increasing and decreasing ramp circuits, each further comprising:

a switchable current source;

a plurality of ramp capacitors coupled in parallel with a common side of said capacitors coupled to said switchable current source; and a selection circuit for selecting certain ones of said capacitors in response to a first portion of said first plurality of digital signals for generating said associated ramp control signals in cooperation with said switchable current source, said switchable current source adapted to switch current flow to said plurality of capacitors in response to said time delay signal whereby said ramp control signal is generated.

4. The apparatus of claim 3 wherein said apparatus further comprises a first clamping circuit which limits said increasing ramp control signal to a preselected maximum voltage level; and a second clamp circuit which limits said decreasing ramp control signal to a preselected minimum voltage level.

5. The apparatus of claim 3 wherein said first delay circuit comprises separate delay circuits coupled to said increasing and decreasing ramp circuits, each delay circuit comprising:
- a switchable resistor circuit coupled to a voltage source;
- a plurality of delay capacitors with first sides of said capacitors coupled together in parallel;
- means for producing a coarse time delay signal in response to a first portion of said second plurality of digital signals for the electrical coupling of said switchable resistor circuit to said first sides of said capacitors.
- a selection circuit for selecting certain ones of said capacitors in response to a second portion of said second plurality of digital signals for generating an RC output signal in cooperation with said switchable resistor circuit and;
- means for providing said time delay signals when said RC output signal reaches a predetermined voltage level.

6. The apparatus of claim 5 wherein said circuit further comprises a combination output circuit coupled to said increasing and decreasing ramp circuits for providing an output signal responsive to the lesser of said ramp control signals.

7. The apparatus of claim 1 wherein said means for storing said digital signals further comprises:
- a random access memory (RAM) coupled to said digital signal producing means which digital signal producing means provides raster scan line and digital signal addresses for said digital signals during writing of said digital signals into RAM; and
- said means for making available said digital signals further comprises:
- a scroll counter coupled between said RAM and said digital signal producing means for passing through said raster scan line addresses during the writing of said digital signals into RAM and for producing sequentially said raster scan line addresses during the reading of said digital signals from said RAM; and
- a digital signal addressing means for providing the addresses of said digital signals for each scan line during the reading of said digital signals from said RAM.

8. A method for smoothing the reproduction of digitally sampled waveforms on a cathode ray tube (CRT) in which the beam is deflected to form a raster of parallel lines for each frame, there being a beam blanking interval between successive frames and between successive lines, said method further comprising:
- producing a plurality of digital signals for defining a trapezoidal beam pattern representative of the amplitude of said sampled waveform along each of a plurality of parallel scan lines;
- storing said digital signals in a storage means for the raster scan lines in a frame during at least one frame blanking interval;
- making available digital signals for each scan line during an associated scan line blanking interval;
- linearly increasing and decreasing the beam width during each raster scan line in response to selected ones of said digital signals for that scan line; and
- delaying the starts of said increasing and decreasing steps during each scan line in response to selected ones of said digital signals for said scan line.

9. The method of claim 8 wherein said step of storing comprises:
- sequentially providing raster scan line addresses through a scroll counter; and
- separately providing digital signal addresses for each scan line.

10. The method of claim 9 wherein said method for making said digital signals available comprises:
- incrementing or decrementing said scroll counter starting from the last address stored in said scroll counter during the step of storing said digital signals to read digital signals from said storage means.

11. The method of claim 10 wherein said method further comprises the steps of:
- scrolling said waveform across a cathode ray tube comprising the steps of:
- continually updating at least on raster scan line stored in said storage means in subsequent frame blanking intervals; and
- storing said updated raster scan lines at raster scan line addresses which are incrementally displaced from their addresses as previously stored by at least one address.

12. The method of claim 11 wherein said step of updating comprises updating within a range of one scan line every other frame to updating six scan lines every frame.

* * * * *